US010269292B2

(12) United States Patent
Bae et al.

(10) Patent No.: US 10,269,292 B2
(45) Date of Patent: *Apr. 23, 2019

(54) DISPLAY DRIVER INTEGRATED CIRCUITS, DEVICES INCLUDING DISPLAY DRIVER INTEGRATED CIRCUITS, AND METHODS OF OPERATING DISPLAY DRIVER INTEGRATED CIRCUITS

(71) Applicant: Samsung Electronics Co., Ltd., Suwon-si, Gyeonggi-do (KR)

(72) Inventors: Jong Kon Bae, Seoul (KR); Won Sik Kang, Seoul (KR); Yang Hyo Kim, Suwon-si (KR); Jae Hyuck Woo, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 170 days.

This patent is subject to a terminal disclaimer.

(21) Appl. No.: 15/274,551

(22) Filed: Sep. 23, 2016

(65) Prior Publication Data

US 2017/0011683 A1 Jan. 12, 2017

Related U.S. Application Data

(63) Continuation of application No. 14/287,333, filed on May 27, 2014, now Pat. No. 9,466,263.

(30) Foreign Application Priority Data

Jun. 13, 2013 (KR) ........................ 10-2013-0067618

(51) Int. Cl.

*H03L 7/00* (2006.01)
*G09G 3/3225* (2016.01)

(Continued)

(52) U.S. Cl.

CPC ......... *G09G 3/3225* (2013.01); *G09G 3/3648* (2013.01); *G09G 5/18* (2013.01);

(Continued)

(58) Field of Classification Search

CPC ...... G09G 3/3225; G09G 3/3648; G09G 5/18; G09G 2320/0247; G09G 2310/08; G09G 2370/08; G09G 3/20

(Continued)

(56) References Cited

U.S. PATENT DOCUMENTS 5,543,754 A 8/1996 Onodera
6,177,922 B1 1/2001 Schiefer et al.

(Continued)

FOREIGN PATENT DOCUMENTS

JP 2004-180125 6/2004
JP 2006-229630 8/2006

(Continued)

OTHER PUBLICATIONS

Office Action, including Search Report dated Nov. 29, 2017 for corresponding Taiwan Application No. 103119727 (3 pages) (no English translation).

(Continued)

*Primary Examiner* — Richard Tan
(74) *Attorney, Agent, or Firm* — Myers Bigel, P.A.

(57) ABSTRACT

Methods of operating a display driver integrated circuit (IC) are provided. A method of operating a display driver IC may include generating a first clock signal, and calculating a frequency of the first clock signal using a second clock signal. Moreover, the method may include generating an adjustment signal using the frequency of the first clock signal and a target frequency, and adjusting the frequency of (Continued)

the first clock signal using the adjustment signal. Related display driver ICs and portable electronic devices are also provided.

19 Claims, 9 Drawing Sheets

(51) Int. Cl.
*G09G 5/18* (2006.01)
*G09G 3/36* (2006.01)
*G09G 3/20* (2006.01)

(52) U.S. Cl.
CPC ........... *G09G 3/20* (2013.01); *G09G 2310/08* (2013.01); *G09G 2320/0247* (2013.01); *G09G 2370/08* (2013.01)

(58) Field of Classification Search
USPC ........................................... 331/34, 137, 140
See application file for complete search history.

(56) References Cited

U.S. PATENT DOCUMENTS

| | | | | |
|---|---|---|---|---|
| 7,863,992 | B2 * | 1/2011 | Chung ................... | H03K 4/501 327/131 |
| 8,212,624 | B2 * | 7/2012 | Tokunaga .............. | H03K 4/501 327/131 |
| 9,122,443 | B1 | 9/2015 | Lamborn et al. | |
| 9,466,263 | B2 * | 10/2016 | Bae .......................... | G09G 5/18 |
| 2002/0188880 | A1 | 12/2002 | Lowles et al. | |
| 2004/0012580 | A1 | 1/2004 | Yamagishi et al. | |
| 2005/0052577 | A1 | 3/2005 | Seth-Smith et al. | |
| 2007/0200843 | A1 | 8/2007 | Bae et al. | |
| 2007/0205971 | A1 | 9/2007 | Bae et al. | |
| 2008/0259221 | A1 * | 10/2008 | Longchambon .. | H04M 1/72527 348/739 |
| 2014/0333608 | A1 * | 11/2014 | Okairi .................. | G09G 3/3648 345/214 |

FOREIGN PATENT DOCUMENTS

| | | | |
|---|---|---|---|
| JP | 2006-338139 | | 12/2006 |
| JP | 2008-107548 | | 5/2008 |
| JP | 2009-296341 | | 12/2009 |
| JP | 2013-054356 | | 3/2013 |
| JP | 2014-219489 | | 11/2014 |
| KR | 1020040027761 | A | 4/2004 |
| KR | 1020050048906 | A | 5/2005 |
| KR | 1020060076871 | A | 7/2006 |
| KR | 1020060078008 | A | 7/2006 |
| KR | 100712553 | B1 | 4/2007 |
| KR | 100744135 | B1 | 7/2007 |
| KR | 1020070094332 | A | 9/2007 |
| KR | 1020100081472 | A | 9/2007 |
| KR | 1020120073833 | A | 7/2012 |
| TW | 200733052 | A | 9/2007 |

OTHER PUBLICATIONS

Japanese Office Action corresponding to Japanese Patent Application No. 2014-121536 (Foreign text, 6 pages) (dated Feb. 27, 2018).

* cited by examiner

DISPLAY DRIVER INTEGRATED CIRCUITS, DEVICES INCLUDING DISPLAY DRIVER INTEGRATED CIRCUITS, AND METHODS OF OPERATING DISPLAY DRIVER INTEGRATED CIRCUITS

CROSS-REFERENCE TO RELATED APPLICATION

This application is a continuation of U.S. patent application Ser. No. 14/287,333, filed May 27, 2014, which itself claims priority under 35 U.S.C. § 119(a) to Korean Patent Application No. 10-2013-0067618, filed on Jun. 13, 2013, the disclosure of which is hereby incorporated herein by reference in its entirety.

BACKGROUND

The present disclosure relates to electronic display devices. With recent developments in smart phones and tablet personal computers (PCs) including high-definition television (HDTV)-level resolution display modules, mobile displays have been developed to provide wide video graphics array (WVGA) or full HD level resolutions. Moreover, the use of a display driver integrated circuit, which is an electronic circuit that drives or controls a flat display panel, appropriate for such high-resolution mobile displays may be desired.

SUMMARY

Various embodiments of the present inventive concepts provide a display driver integrated circuit (IC). The display driver IC may include an oscillator configured to generate a first clock signal. The display driver IC may include a frequency compensation circuit configured to calculate a frequency of the first clock signal using a second clock signal that is input from outside of the display driver IC, and to generate an adjustment signal using the calculated frequency and a target frequency. Moreover, the oscillator may be configured to adjust the frequency of the first clock signal using the adjustment signal.

In various embodiments, the oscillator may include a Resistor-Capacitor (RC) control circuit configured to control an RC value that is inversely proportional with the frequency of the first clock signal using the adjustment signal. In some embodiments, the oscillator may include a current control circuit configured to control an amount of current related to the frequency of the first clock signal using the adjustment signal. Moreover, the display driver IC may include a mobile industry processor interface (MIPI) configured to transmit the second clock signal to the frequency compensation circuit.

According to various embodiments, the frequency compensation circuit may include a reference time setting circuit, a reference sync signal generation circuit, a counter, a frequency calculation circuit, and an adjustment signal generation circuit. The reference time setting circuit may be configured to set a reference time using a reference time setting signal. The reference sync signal generation circuit may be configured to generate a reference sync signal corresponding to the reference time using the second clock signal. The counter may be configured to count a number of toggles of the first clock signal during a single period of the reference sync signal and to output a count value. The frequency calculation circuit may be configured to calculate the frequency of the first clock signal using the reference time and the count value. The adjustment signal generation circuit may be configured to generate the adjustment signal using the target frequency and the calculated frequency.

In various embodiments, the reference time setting signal may include a first signal indicating at least one of a frequency and a period of the second clock signal and a second signal indicating a number of toggles of the second clock signal. In some embodiments, the frequency compensation circuit may include a register configured to store a setting signal that controls enable and disable functions of the reference sync signal generation circuit. Moreover, the adjustment signal generation circuit may include an offset calculation circuit configured to calculate an offset between the target frequency and the calculated frequency, and an adjustment signal generator configured to generate the adjustment signal using the offset and the target frequency. In some embodiments, the offset calculation circuit may be configured to control a resolution of the offset using resolution control information. In some embodiments, the adjustment signal generator may be configured to output one of the adjustment signal and a target control signal corresponding to the target frequency as the adjustment signal in response to a selection signal.

A portable electronic device, according to various embodiments, may include a display driver integrated circuit (IC) and an application processor configured to control an operation of the display driver IC. The display driver IC may include an oscillator configured to generate a first clock signal, and a frequency compensation circuit configured to calculate a frequency of the first clock signal using a second clock signal output from the application processor and to generate an adjustment signal using the calculated frequency and a target frequency. The oscillator may be configured to adjust the frequency of the first clock signal using the adjustment signal. In some embodiments, the display driver IC may include a mobile industry processor interface (MIPI®) configured to transmit the second clock signal to the frequency compensation circuit.

In various embodiments, the frequency compensation circuit may include a reference time setting circuit, a reference sync signal generation circuit, a counter, a frequency calculation circuit, and an adjustment signal generation circuit. The reference time setting circuit may be configured to set a reference time using a reference time setting signal. The reference sync signal generation circuit may be configured to generate a reference sync signal corresponding to the reference time using the second clock signal. The counter may be configured to count a number of toggles of the first clock signal during a single period of the reference sync signal and to output a count value. The frequency calculation circuit may be configured to calculate the frequency of the first clock signal using the reference time and the count value. The adjustment signal generation circuit may be configured to generate the adjustment signal using the target frequency and the calculated frequency.

According to various embodiments, the frequency compensation circuit may include a register configured to store the reference time setting signal, and the reference time setting signal may include a first signal indicating at least one of a frequency and period of the second clock signal and a second signal indicating a number of toggles of the second clock signal. In some embodiments, the adjustment signal generation circuit may include an offset calculation circuit configured to calculate an offset between the target frequency and the calculated frequency, and an adjustment signal generator configured to generate the adjustment signal using the offset and the target frequency.

In various embodiments, the frequency compensation circuit may include a register configured to store an external resolution control signal, and the offset calculation circuit may be configured to control a resolution of the offset using the resolution control signal. In some embodiments, the frequency compensation circuit may include a register configured to store an external control signal, and the offset calculation circuit may be configured to be enabled and disabled in response to the control signal. In some embodiments, the frequency compensation circuit may include a register configured to store an external selection signal, and the adjustment signal generator may be configured to output one of the adjustment signal and a target control signal corresponding to the target frequency as the adjustment signal in response to the selection signal. Moreover, the portable electronic device may include a graphic memory configured to operate in response to the adjusted frequency of the first clock signal.

A method of operating a display driver integrated circuit (IC), according to various embodiments, may include generating a first clock signal, receiving a second clock signal from outside of the display driver IC, and calculating a first frequency of the first clock signal using the second clock signal. Moreover, the method may include generating an adjustment signal using the first frequency of the first clock signal and a target frequency, and adjusting the first frequency of the first clock signal to a second frequency using the adjustment signal. In some embodiments, the method may include, after adjusting the first frequency of the first clock signal to the second frequency, comparing the second frequency with the target frequency. Moreover, the method may include, in response to determining that the second frequency is different from the target frequency or is outside of a predetermined range from the target frequency, adjusting the second frequency to a third frequency.

In various embodiments, the adjustment signal may include a first adjustment signal, and the method may include generating a second adjustment signal using the second frequency and the target frequency. Moreover, adjusting the second frequency to the third frequency may include adjusting the second frequency to the third frequency using the second adjustment signal.

In some embodiments, generating the first clock signal may include generating the first clock signal using an oscillator. Calculating the first frequency may include calculating, using a frequency compensation circuit, the first frequency of the first clock signal using the second clock signal. Generating the adjustment signal may include generating, using the frequency compensation circuit, the adjustment signal using the first frequency of the first clock signal and the target frequency. Moreover, adjusting the first frequency may include adjusting, using the oscillator, the first frequency of the first clock signal to the second frequency using the adjustment signal. In some embodiments, the method may include comparing the third frequency with the target frequency. In some embodiments, receiving the second clock signal from outside of the display driver IC may include receiving the second clock signal through a serial interface.

According to various embodiments, calculating the first frequency of the first clock signal may include setting a reference time using a reference time setting signal, generating a reference sync signal corresponding to the reference time using the second clock signal, counting a number of toggles of the first clock signal during a single period of the reference sync signal and outputting a count value, and calculating the first frequency of the first clock signal using the reference time and the count value. Moreover, generating the adjustment signal may include calculating an offset between the target frequency and the first frequency, and generating the adjustment signal using the offset and the target frequency.

BRIEF DESCRIPTION OF THE DRAWINGS

The above and other features and advantages of the disclosure will become more apparent in view of the attached drawings and accompanying detailed description.

DETAILED DESCRIPTION

Figure 1:
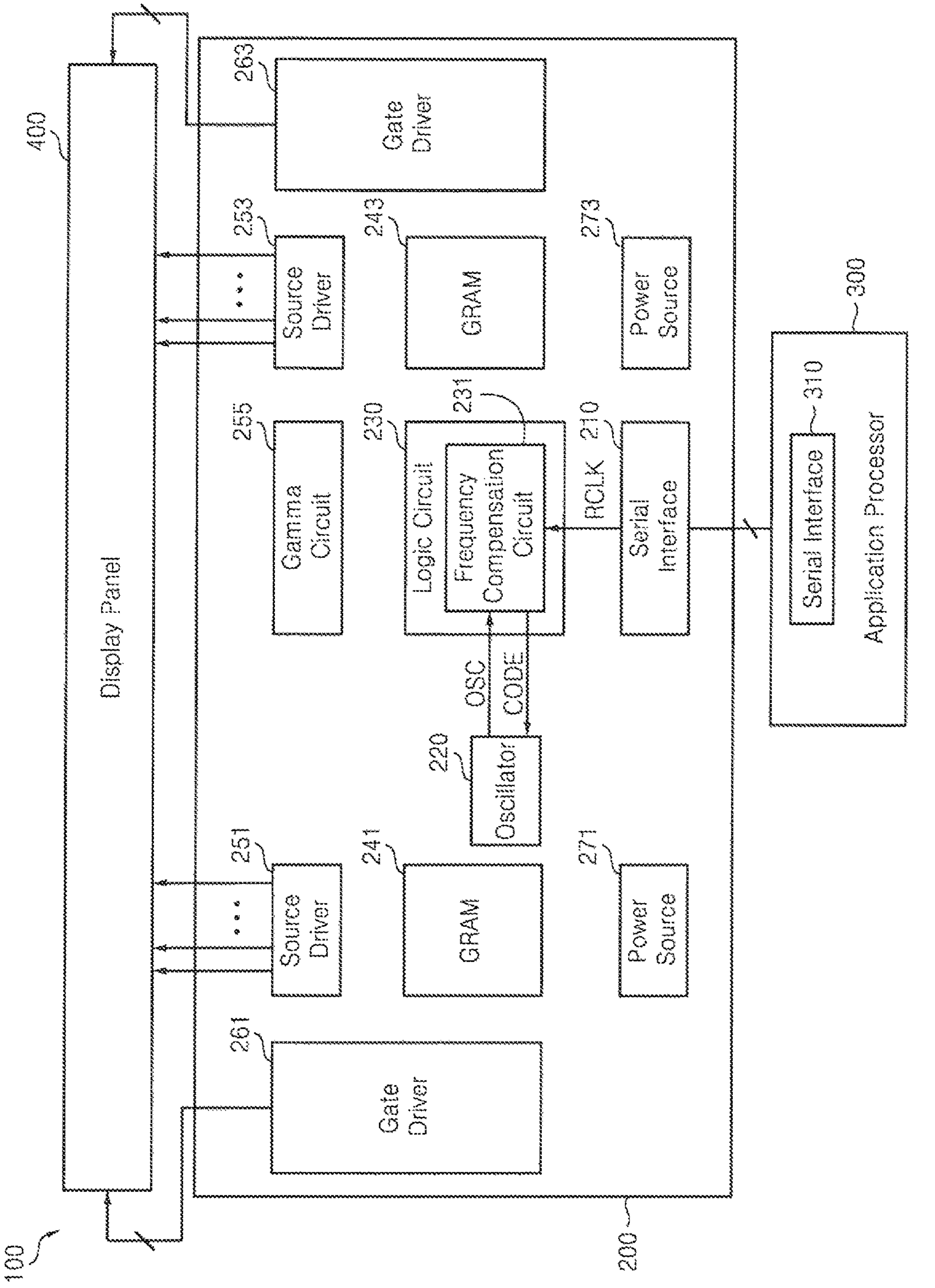
FIG. 1 is a block diagram of a display system, according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms “a,” “an,” and “the” are intended to include the plural forms as well, unless the context clearly indicates otherwise. It will be further understood that the terms “comprises,” “comprising,” “includes,” and/or “including,” when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on" another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc, may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram of a display system 100, according to various embodiments of the present inventive concepts. The display system 100 includes a display driver integrated circuit (IC) 200, an application processor 300, and a display panel 400.

The display system 100 may be implemented as a portable electronic device including the display panel 400. The portable electronic device may be implemented as a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, or an e-book.

The display driver IC 200 may display data on the display panel 400 according to the control of a processor, e.g., the application processor 300. When the display driver IC 200 is used in a mobile device, the display driver IC 200 may be called a mobile display driver IC.

The display driver IC 200 includes a serial interface 210, an oscillator 220, a logic circuit 230, and one or more graphic memories (e.g., Graphic RAMs (GRAMs)) 241 and 243. The serial interface 210 of the display driver IC 200 performs serial communication with a serial interface 310 included in the application processor 300.

The serial interfaces 210 and 310 may be interfaces suitable for serial interface such as mobile industry processor interface (MIPI®), mobile display digital interface (MDDI), DisplayPort, or embedded DisplayPort (eDP). For instance, each of the serial interfaces 210 and 310 may be a MIPI interface or a display serial interface (DSI). The oscillator 220 generates a first clock signal OSC.

The logic circuit 230 is an electronic circuit that generates control signals necessary for the operation of the display driver IC 200. The logic circuit 230 may include a frequency compensation circuit 231. The frequency compensation circuit 231 calculates a current frequency of the first clock signal OSC generated by the oscillator 220 using a second clock signal RCLK input from outside of the display driver IC 200 and generates an adjustment signal CODE using a target frequency and the current frequency.

The adjustment signal CODE may be a digital signal including at least one bit. The oscillator 220 adjusts the frequency of the first clock signal OSC based on the adjustment signal CODE output from the frequency compensation circuit 231 and outputs the frequency adjusted first clock signal OSC to the frequency compensation circuit 231.

Accordingly, the oscillator 220 can control the frequency of the first clock signal OSC in real time (or on-the-fly) in association with the frequency compensation circuit 231 until the frequency of the first clock signal OSC becomes the same as the target frequency or until it enters the allowable range for the target frequency.

The frequency compensation circuit 231 may control the frequency of the first clock signal OSC of the oscillator 220 using the second clock signal RCLK, which has been externally input, as a reference clock signal. Therefore, the oscillator 220 can generate the first clock signal OSC having a frequency the same as or similar to the target frequency according to the adjustment signal CODE, despite process variation, voltage variation, and/or temperature variation.

The first clock signal OSC may be supplied to the graphic memories 241 and 243. The graphic memories 241 and 243 may process (e.g., store) image data or graphic data to be displayed on the display panel 400.

The display driver IC 200 may also include one or more source drivers 251 and 253, a gamma circuit 255, one or more gate drivers 261 and 263, and one or more power sources 271 and 273.

Although FIG. 1 illustrates that the display driver IC 200 includes two source drivers 251 and 253, one gamma circuit 255, two gate drivers 261 and 263, and two power sources 271 and 273 in some embodiments, it will be understood that the structure of the display driver IC 200 is not restricted to these quantities.

The source drivers 251 and 253 may drive signals corresponding to image data or graphic data output from the graphic memories 241 and 243 to data lines of the display panel 400 using a gamma voltage output from the gamma circuit 255.

The gate drivers 261 and 263 may drive gate lines of the display panel 400. In other words, the operation of pixels in the display panel 400 is controlled by the source drivers 251 and 253 and the gate drivers 261 and 263, so that an image corresponding to the image data or graphic data output from the graphic memories 241 and 243 is displayed on the display panel 400.

The power sources 271 and 273 may supply necessary power to the elements 210, 220, 230, 231, 241, 243, 251, 253, 255, 261, 263, and 400. Alternatively, power for the display panel 400 may be provided from a separate power source. The first clock signal OSC may be applied to the graphic memories 241 and 243, the source drivers 251 and 253, and/or the gate drivers 261 and 263.

The display panel 400 may be included in a display. The display may be implemented as a thin film transistor liquid crystal display (TFT-LCD), a light emitting diode (LED) display, an organic LED (OLED) display, an active-matrix OLED (AMOLED) display, or a flexible display.

Figure 2:
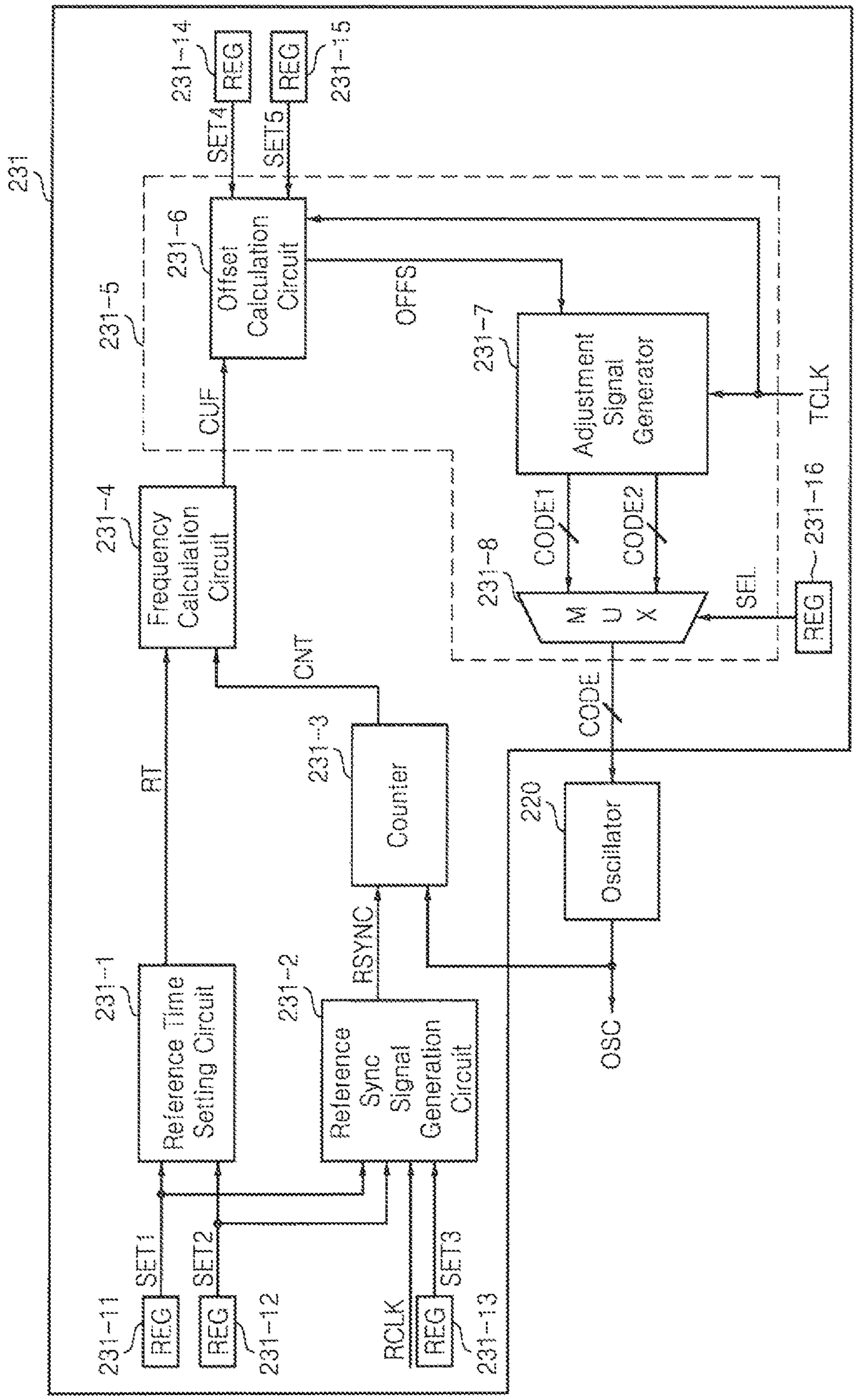
FIG. 2 is a block diagram of a frequency compensation circuit illustrated in FIG. 1, according to various embodiments of the present inventive concepts.

FIG. 2 is a block diagram of the frequency compensation circuit 231 illustrated in FIG. 1, according to various embodiments of the present inventive concepts. Referring to FIGS. 1 and 2, the frequency compensation circuit 231 includes a reference time setting circuit 231-1, a reference sync signal generation circuit 231-2, a counter 231-3, a frequency calculation circuit 231-4, and an adjustment signal generation circuit 231-5.

The reference time setting circuit 231-1 sets or calculates a reference time RT based on a reference time setting signal. The reference time setting signal may include a first setting signal SET1 indicating at least one of the frequency and period of the second clock signal RCLK and a second setting signal SET2 indicating the number of toggles of the second clock signal RCLK. Alternatively, the second setting signal SET2 may indicate the number of rising edges of the second clock signal RCLK.

The first setting signal SET1 indicating at least one of the frequency and period of the second clock signal RCLK may be programmed to a first register 231-11. The second setting signal SET2 indicating the number of toggles or rising edges of the second clock signal RCLK may be programmed to a second register 231-12. The first register 231-11 and the second register 231-12 may be implemented together in a single register.

The reference sync signal generation circuit 231-2 generates a reference sync signal RSYNC corresponding to the reference time RT using the second clock signal RCLK. The reference sync signal generation circuit 231-2 may be enabled or disabled in response to a third setting signal SET3.

If the reference sync signal generation circuit 231-2 has been enabled in response to the third setting signal SET3 at a first level, e.g., a high level, then the reference sync signal generation circuit 231-2 may generate the reference sync signal RSYNC. If on the other hand, the reference sync signal generation circuit 231-2 has been disabled in response to the third setting signal SET3 at a second level, e.g., a low level, then the reference sync signal generation circuit 231-2 may not generate the reference sync signal RSYNC.

The third setting signal SET3 may be programmed to a third register 231-13. The counter 231-3 counts the number of toggles or rising edges of the first clock signal OSC during one period of the reference sync signal RSYNC and outputs a count value CNT.

The frequency calculation circuit 231-4 calculates a current frequency CUF of the first clock signal OSC using the reference time RT and the count value CNT. The adjustment signal generation circuit 231-5 generates the adjustment signal CODE using a target frequency of a target clock signal TCLK and the current frequency CUF. At this time, the target clock signal TCLK may be information or data enabling the target clock signal TCLK having the target frequency to be generated. The information may be programmed as the adjustment signal CODE to the oscillator 220.

The adjustment signal generation circuit 231-5 includes an offset calculation circuit 231-6, an adjustment signal generator 231-7, and a selection circuit 231-8.

The offset calculation circuit 231-6 calculates an offset (or a difference) between the target frequency of the target clock signal TCLK and the current frequency CUF and outputs a calculated offset OFFS.

The offset calculation circuit 231-6 may control the resolution of the offset based on a fourth setting signal SET4, which is a resolution control signal. The resolution, e.g., 0.1 MegaHertz. (MHz), 0.5 MHz, 1 MHz, or 2 MHz indicates how precisely the offset is calculated.

The fourth setting signal SET4 may be programmed to a fourth register 231-14. A fifth setting signal SET5 for controlling the enable or disable of the offset calculation circuit 231-6 may be programmed to a fifth register 231-15.

The adjustment signal generator 231-7 may generate an adjustment signal CODE1 or CODE2 using the target frequency of the target clock signal TCLK and the calculated offset OFFS. The first adjustment signal CODE1 is related to both the target frequency of the target clock signal TCLK and the calculated offset OFFS. The second adjustment signal CODE2 is related to only the target frequency of the target clock signal TCLK.

The selection circuit 231-8 may output the first adjustment signal CODE1 or the second adjustment signal CODE2 as the adjustment signal CODE to the oscillator 220 in response to a selection signal SEL. In some embodiments, the adjustment signal generator 231-7 may include the selection circuit 231-8. Moreover, the selection signal SEL may be programmed to a sixth register 231-16.

Each of the registers 231-11 through 231-16 is an example of a programmable memory. The registers 231-11 through 231-16 may be programmed by the logic circuit 230. Alternatively, the registers 231-11 through 231-16 may be programmed by the application processor 300, or may be programmed differently by each manufacturer or program engineer of the display driver IC 200. Each of the setting signals SET1 through SET5 is one or more digital signals including one or more bits.

The oscillator 220 may control the frequency of the first clock signal OSC according to the adjustment signal CODE. A method by which the oscillator 220 controls the frequency of the first clock signal OSC based on the adjustment signal CODE is described with reference to FIGS. 3 through 7.

For clarity of the description, it is assumed that the circuits 231-2 and 231-6 are enabled, the first setting signal SET1 indicates 9 nanoseconds (ns), the second setting signal SET2 indicates 200, the target frequency of the target clock signal TCLK is 52.5 MHz, the adjustment signal CODE is CODE1-1, the fourth setting signal SET4 indicates 0.1 MHz, and the second clock signal RCLK has a frequency of 888 Megabits per second (Mbps), i.e., 111.1 MHz and a period of 9 ns.

The oscillator 220 generates the first clock signal OSC having a frequency corresponding to the adjustment signal CODE (=CODE1-1). The reference time setting circuit 231-1 sets or calculates the reference time RT (=9 ns*200=800 ns) based on the product of the first setting signal SET1 (=9 ns) and the second setting signal SET2 (=200).

The reference sync signal generation circuit 231-2 generates the reference sync signal RSYNC corresponding to the reference time RT (=1800 ns) using the second clock signal RCLK. At this time, the frequency of the reference sync signal RSYNC is 555.5 kilohertz (KHz).

The counter 231-3 counts the number of toggles (or rising edges) of the first clock signal OSC during one period P (=1800 ns) of the reference sync signal RSYNC and outputs the count value CNT (=CNT1).

When the count value CNT (=CNT1) is 90, the frequency calculation circuit 231-4 calculates the current frequency CUF of the first clock signal OSC using the reference time RT (=1800 ns) and the count value CNT (=CNT1=90).

For instance, the frequency calculation circuit 231-4 may obtain a value (e.g., a period) by dividing the reference time RT (=1800 ns) by the count value CNT (=CNT1=90) and calculate the current frequency CUF of the first clock signal OSC using the obtained value. In other words, the current frequency CUF of the first clock signal OSC may be calculated as 50 MHz.

In other words, the oscillator 220 outputs the first clock signal OSC having an actual frequency of 50 MHz according to process variation, voltage variation, and/or temperature variation instead of outputting the first clock signal OSC having the target frequency of 52.5 MHz.

The offset calculation circuit 231-6 calculates an offset, i.e., a difference (=2.5 MHz) between the target frequency (=52.5 MHz) of the target clock signal TCLK and the current frequency CUF (=50 MHz) of the first clock signal OSC according to an offset resolution (=0.1) corresponding to the fourth setting signal SET4. The offset calculation circuit 231-6 outputs the difference as the offset OFFS (=2.5 MHz).

The adjustment signal generator 231-7 outputs an adjustment signal CODE1-2 for increasing the frequency of the first clock signal OSC to the oscillator 220 based on the offset OFFS (=2.5 MHz). The oscillator 220 increases the frequency of the first clock signal OSC in response to the adjustment signal CODE1-2.

When the count value CNT (=CNT2) obtained after the increase, i.e., the control of the frequency of the first clock signal OSC, is 94, the frequency calculation circuit 231-4 calculates a value corresponding to the reciprocal of a value (=1800 ns/94) obtained by dividing the reference time RT (=1800 ns) by the count value CNT (=CNT2=94) as the current frequency CUF of the first clock signal OSC. At this time, the current frequency CUF of the first clock signal OSC is calculated as 52.2 MHz.

The offset calculation circuit 231-6 calculates the offset, i.e., the difference (=0.3 MHz) between the target frequency (=52.5 MHz) of the target clock signal TCLK and the current frequency CUF (=52.2 MHz) of the first clock signal OSC and outputs the difference as the offset OFFS (=0.3 MHz). The adjustment signal generator 231-7 outputs the adjustment signal CODE for increasing the frequency of the first clock signal OSC to the oscillator 220 based on the offset OFFS (=0.3 MHz).

The oscillator 220 increases the frequency of the first clock signal OSC in response to the adjustment signal CODE. When the count value CNT obtained after the increase, i.e., the control of the frequency of the first clock signal OSC, is 95, the frequency calculation circuit 231-4 calculates a value corresponding to the reciprocal of a value (=1800 ns/95) obtained by dividing the reference time RT (=1800 ns) by the count value CNT (=95) as the current frequency CUF of the first clock signal OSC. At this time, the current frequency CUF of the first clock signal OSC is calculated as 52.8 MHz.

The offset calculation circuit 231-6 calculates the offset, i.e., the difference (=−0.3 MHz) between the target frequency (=52.5 MHz) of the target clock signal TCLK and the current frequency CUF (=52.8 MHz) of the first clock signal OSC and outputs the difference as the offset OFFS (=−0.3 MHz).

The adjustment signal generator 231-7 outputs the adjustment signal CODE for decreasing the frequency of the first clock signal OSC to the oscillator 220 based on the offset OFFS (=−0.3 MHz). The oscillator 220 decreases the frequency of the first clock signal OSC in response to the adjustment signal CODE.

Through the above-described procedure, the oscillator 220 may generate the first clock signal OSC having a frequency, e.g. 52.2 MHz or 52.8 MHz, very close to the target frequency, e.g., 52.5 MHz, of the target clock signal TCLK.

Figure 3:
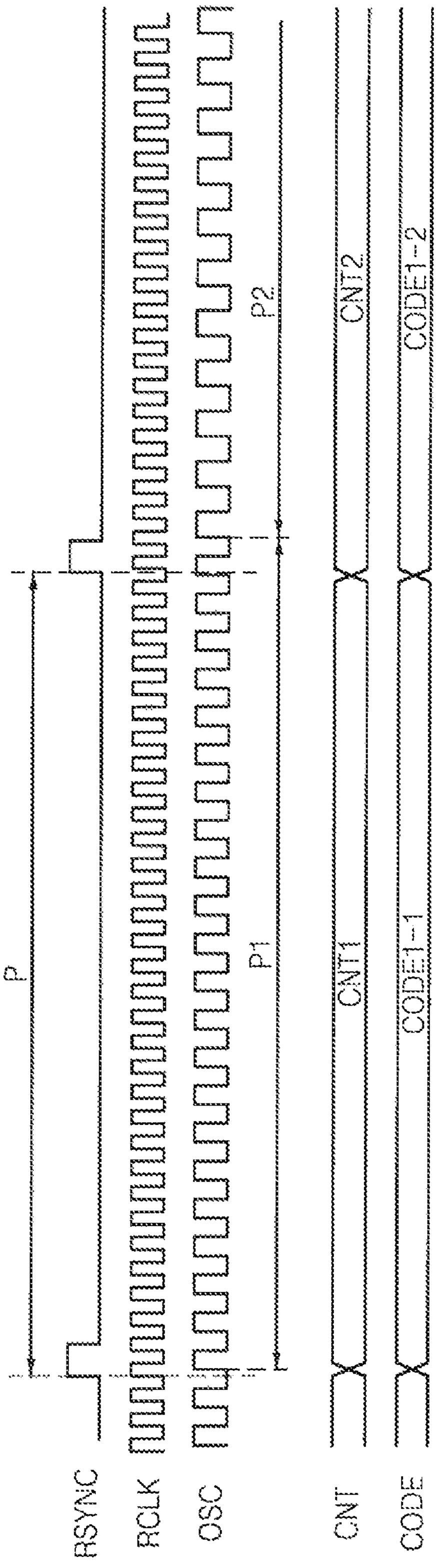
FIG. 3 is a timing chart of the signals used in the frequency compensation circuit illustrated in FIG. 2, according to various embodiments of the present inventive concepts.

The values used in the description of various embodiments illustrated in FIG. 3 are selected as examples to describe the operation of the frequency compensation circuit 231. Consequently, even though the oscillator 220 may generate the first clock signal OSC having a frequency different from the target frequency of the target clock signal TCLK due to process variation, voltage variation, and/or temperature variation, the oscillator 220 may adjust the frequency of the first clock signal OSC in real time in response to the adjustment signal CODE until the frequency of the first clock signal OSC is the same as the target frequency of the target clock signal TCLK or enters the allowable range for the target frequency.

In FIG. 3, P1 denotes a toggling period of the first clock signal OSC having an initial frequency and P2 denotes a toggling period of the first clock signal OSC that has been frequency-adjusted.

Figure 4:
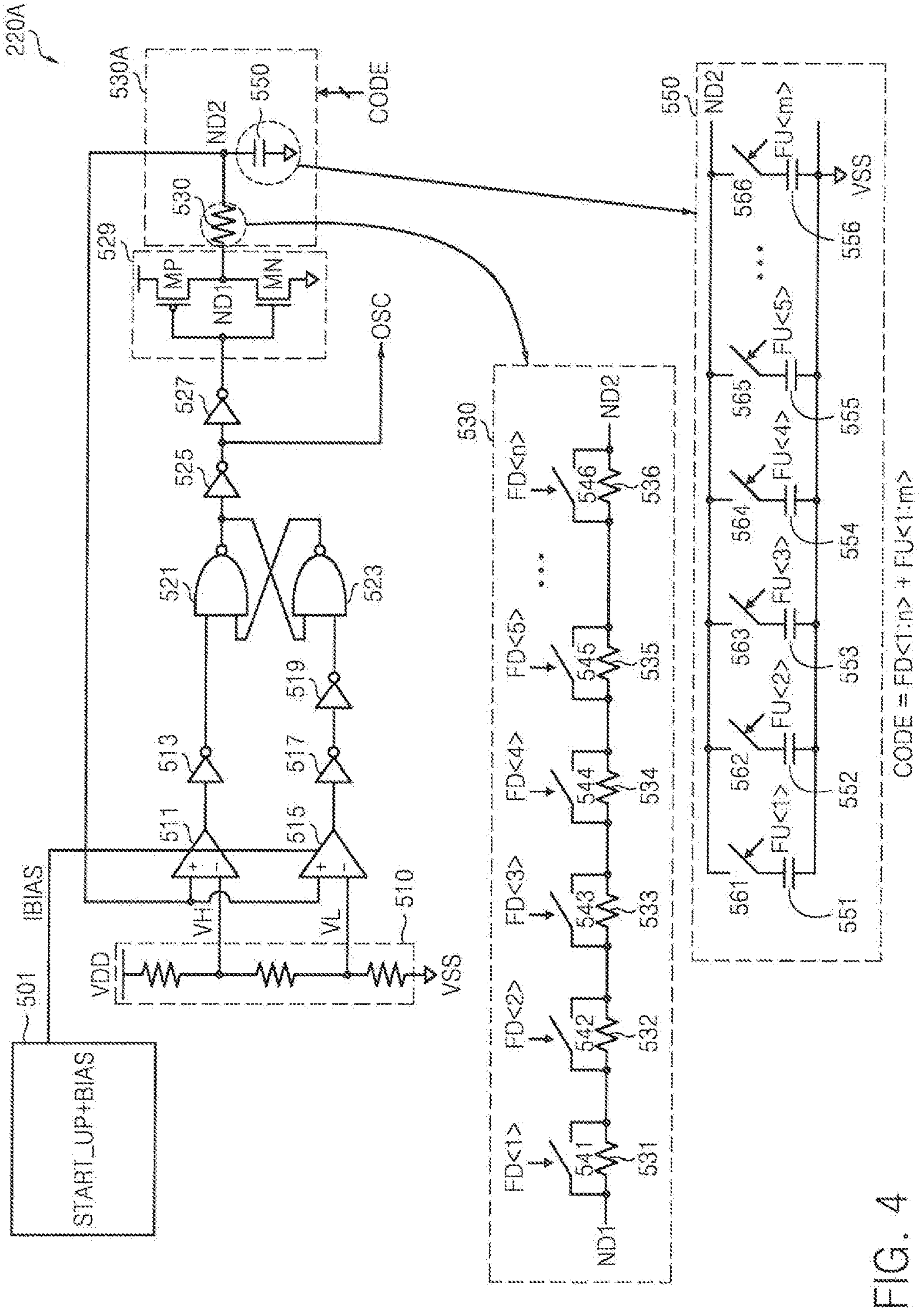
FIG. 4 is a diagram of an example of an oscillator illustrated in FIG. 2, according to various embodiments of the present inventive concepts.

FIG. 4 is a diagram of an example 220A of the oscillator 220 illustrated in FIG. 2, according to various embodiments of the present inventive concepts. Referring to FIG. 4, the oscillator 220A may be implemented as a resistor-capacitor (RC) relaxation oscillator or a square wave oscillator.

The oscillator 220A includes an RC control circuit 530A that controls an RC value related to the frequency of the first clock signal OSC based on the adjustment signal CODE. The RC control circuit 530A includes a variable resistance circuit 530 and a variable capacitor circuit 550. The oscillator 220A includes a bias current generation circuit 501, a voltage divider circuit 510, comparators 511 and 515, gate circuits 513, 517, 519, 521, 523, 525, and 527, a driver 529, and the RC control circuit 530A.

The bias current generation circuit 501 generates a bias current IBIAS to be supplied to the comparators 511 and 515. The voltage divider circuit 510 includes a plurality of resistors connected in series between a power supply line for the supply of a power supply voltage VDD and a ground VSS. The voltage divider circuit 510 generates divided voltages VH and VL using the resistors.

The first comparator 511 compares the first divided voltage VH with a voltage of a second node ND2 and outputs a first comparison signal corresponding to the comparison result. The inverter 513 inverts the first comparison signal output from the first comparator 511.

The second comparator 515 compares the second divided voltage VL with a voltage of the second node ND2 and outputs a second comparison signal corresponding to the comparison result. The inverter 517 inverts the second comparison signal output from the second comparator 515. The inverter 519 inverts an output signal of the inverter 517.

The first NAND gate 521 performs a NAND operation on an output signal of the inverter 513 and an output signal of the second NAND gate 523. The second NAND gate 523 performs a NAND operation on an output signal of the inverter 519 and an output signal of the first NAND gate 521. The inverter 525 inverts the output signal of the first NAND gate 521. The inverter 527 inverts an output signal of the inverter 525. The first clock signal OSC is generated from the inverter 525.

The driver 529 functioning as an inverter includes transistors MP and MN connected in series between the power line for the supply of the power supply voltage VDD and the ground VSS. The P-channel metal oxide semiconductor (PMOS) transistor MP pulls the voltage of the first node ND1 up to the power supply voltage VDD. The transistor MN pulls the voltage of a first node ND2 down to the ground VSS.

The variable resistance circuit 530 is connected between the first node ND1 and the second node ND2. The variable resistance circuit 530 includes a plurality of resistors 531 through 536 connected in series and a plurality of switches 541 through 546.

The resistors 531 through 536 may have the same or different resistance. A weight may be added to the resistance value of each of the resistors 531 through 536. The switches 541 through 546 are switched in response to first adjustment signals FD<1> through FD<n>, respectively, where "n" is a natural number.

The variable capacitor circuit 550 is connected between the second node ND2 and the ground VSS. The variable capacitor circuit 550 includes a plurality of capacitor units connected in parallel.

The capacitor units may include capacitors 551 through 556, respectively, and switches 561 and 566, respectively. The capacitors 551 through 556 may have the same or different capacitance. A weight may be added to the capacitance of each of the capacitors 551 through 556. The switches 561 through 566 are switched in response to second adjustment signals FU<1> through FU<m>, respectively, where "m" is a natural number and n=m or n≠m.

The first adjustment signals FD<1> through FD<n> and the second adjustment signals FU<1> through FU<m> may be parts of the adjustment signal CODE. A total resistance R of the variable resistance circuit 530 is adjusted by the first adjustment signals FD<1> through FD<n> and a total capacitance C of the variable capacitor circuit 550 is adjusted by the second adjustment signals FU<1> through FU<m>.

Consequently, the RC value of the RC control circuit 530A is adjusted by the first adjustment signals FD<1> through FD<1> and the second adjustment signals FU<1> through FU<m>, so that the frequency of the first clock signal OSC of the oscillator 220A is adjusted. At this time, the frequency of the first clock signal OSC of the oscillator 220A is in inverse proportion to the RC value of the RC control circuit 530A and it is also in inverse proportion to a difference between the first divided voltage VH and the second divided voltage VL. When the RC value of the RC control circuit 530A increases, the frequency of the first clock signal OSC of the oscillator 220A decreases.

Figure 5:
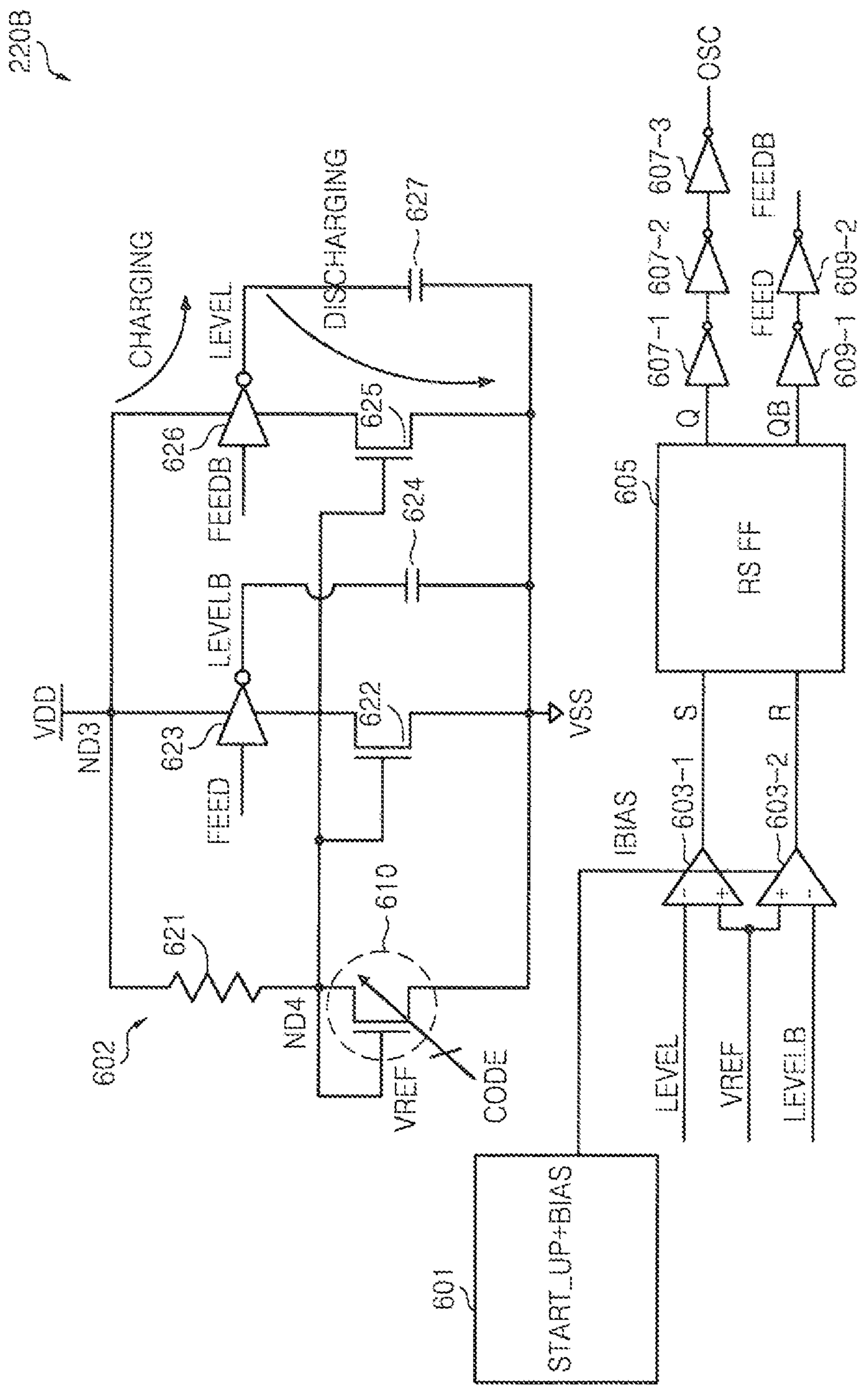
FIG. 5 is a diagram of another example of the oscillator illustrated in FIG. 2, according to various embodiments of the present inventive concepts.
Figure 6:
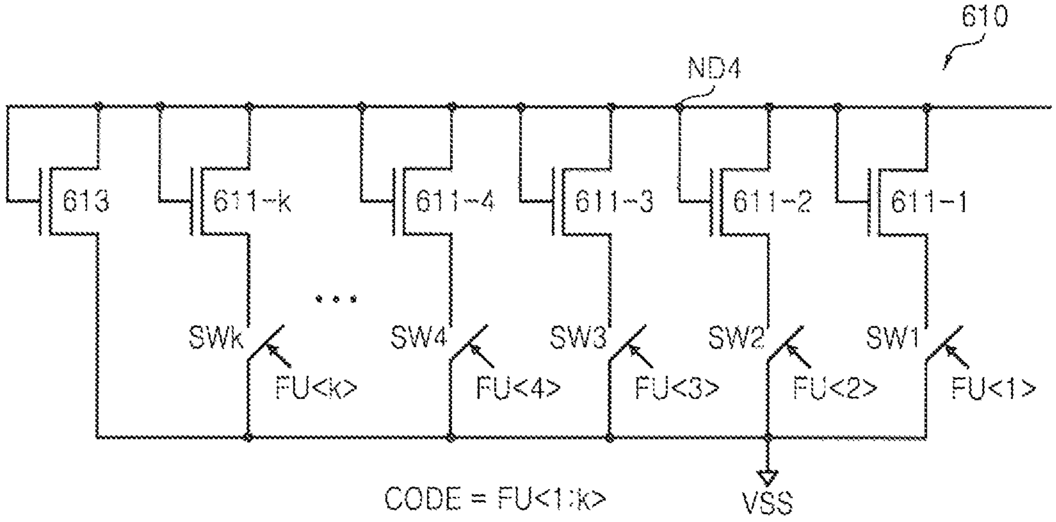
FIG. 6 is a diagram of a current control circuit illustrated in FIG. 5, according to various embodiments of the present inventive concepts.
Figure 7:
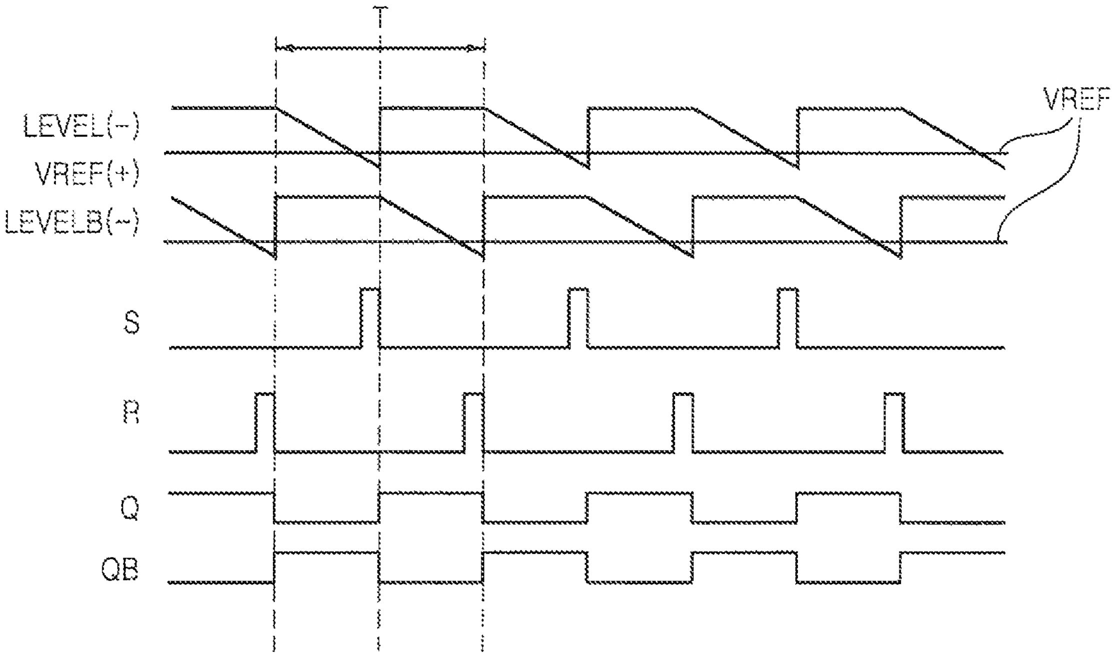
FIG. 7 is a timing chart of the signals used in an oscillator illustrated in FIG. 5, according to various embodiments of the present inventive concepts.

FIG. 5 is a diagram of another example 220B of the oscillator 220 illustrated in FIG. 2, according to various embodiments of the present inventive concepts. FIG. 6 is a diagram of a current control circuit 610 illustrated in FIG. 5, according to various embodiments of the present inventive concepts. FIG. 7 is a timing chart of the signals used in the oscillator 220B illustrated in FIG. 5, according to various embodiments of the present inventive concepts.

Referring to FIG. 5, the oscillator 220B includes the current control circuit 610 that controls the amount of current related with the frequency of the first clock signal OSC based on the adjustment signal CODE. The oscillator 220B includes a bias current generation circuit 601, a control signal generation circuit 602, comparators 603-1 and 603-2, an RS flip-flop (FF) 605, and a plurality of gate circuits 607-1, 607-2, 607-3, 609-1, and 609-2.

The bias current generation circuit 601 generates a bias current IBIAS to be supplied to the comparators 603-1 and 603-2. The control signal generation circuit 602 generates control voltages VREF, LEVEL, and LEVELB in response to feedback signals FEED and FEEDB and the adjustment signal CODE. The current control circuit 610 is connected between a fourth node ND4 and the ground VSS. The current control circuit 610 controls the level of the first control voltage VREF in response to the adjustment signal CODE.

A resistor 621 is connected between a third node ND3 transmitting the power supply voltage VDD and the fourth node ND4. A transistor 622 is connected between an inverter 623 and the ground VSS and is gated with the voltage VREF of the fourth node ND4. The inverter 623 is connected between the third node ND3 and the transistor 622 and it controls the level of the third control voltage LEVELB in response to the first feedback signal FEED. A capacitor 624 is connected between an output terminal of the inverter 623 and the ground VSS.

For example, the inverter 623 pulls up a voltage of the output terminal of the inverter 623 to the power supply voltage VDD in response to the first feedback signal FEED or pulls down the voltage of the output terminal of the inverter 623 to the ground VSS through the transistor 622 in response to the first feedback signal FEED. In other words, the capacitor 624 may be charged or discharged according to the operations of the transistor 622 and the inverter 623.

A transistor 625 is connected between an inverter 626 and the ground VSS and is gated with the voltage VREF of the fourth node ND4. The inverter 626 is connected between the third node ND3 and the transistor 625. The inverter 626 controls the level of the second control voltage LEVEL in response to the second feedback signal FEEDB. A capacitor 627 is connected between an output terminal of the inverter 626 and the ground VSS.

The inverter 626 pulls up a voltage of the output terminal of the inverter 626 to the power supply voltage VDD in response to the second feedback signal FEEDB or pulls down the voltage of the output terminal of the inverter 626 to the ground VSS through the transistor 625 in response to the second feedback signal FEEDB. In other words, the capacitor 627 may be charged or discharged according to the operations of the transistor 625 and the inverter 626.

Referring to FIG. 6, the current control circuit 610 includes transistors 611-1 through **611-*k* and 613 connected in parallel to the fourth node ND4 and switches SW1 through SWk respectively connected to the transistors 611-1 through 611-*k*. The switches SW1** through SWk are switched in response to adjustment signals FU<1> through FU<k>. The adjustment signal CODE includes the adjustment signals FU<1> through FU<k>.

When the number of transistors turned on among the transistors 611-1 through **611-*k* increases according to the adjustment signals FU<1> through FU<k>, the amount of current flowing in the current control circuit 610** also increases. Accordingly, the level of the first control voltage VREF decreases. As a result, the frequency of the first clock signal OSC decreases. A frequency Freq of the first clock signal OSC may be expressed by:

$$\mathrm{Freq} \propto \frac{W_2}{W_1 RC},$$

where $W_2$ is a channel width of the transistors 622 and 625, $W_1$ is a total channel width of the transistors 611-1 through **611-*k* and 613 included in the current control circuit 610, and RC is an RC value of the current control circuit 610 necessary to generate the first clock signal OSC. In other words, the oscillator 220**B compares two of the control voltages VREF, LEVEL, and LEVELB with each other and adjusts the frequency of the first clock signal OSC according to the comparison result.

The first comparator 603-1 compares the first control voltage VREF with the second control voltage LEVEL and generates a set signal S according to the comparison result. The second comparator 603-2 compares the first control voltage VREF with the second control voltage LEVELB and generates a reset signal R according to the comparison result.

The RS FF 605 generates an output signal Q and a complementary output signal QB in response to the set signal S and the reset signal R. The inverter 607-1 inverts the output signal Q. The inverter 607-2 inverts an output signal of the inverter 607-1. The inverter 607-3 connected to an output terminal of the inverter 607-2 outputs the first clock signal OSC.

The inverter 609-1 generates the first feedback signal FEED in response to the complementary output signal QB. The inverter 609-2 generates the second feedback signal FEEDB in response to the first feedback signal FEED. FIG. 7 illustrates the relationship among the waveforms of the control voltages VREF, LEVEL, and LEVELB, the waveforms of the set signal S and the reset signal R, and the waveforms of the output signal Q and the complementary output signal QB.

Figure 8:
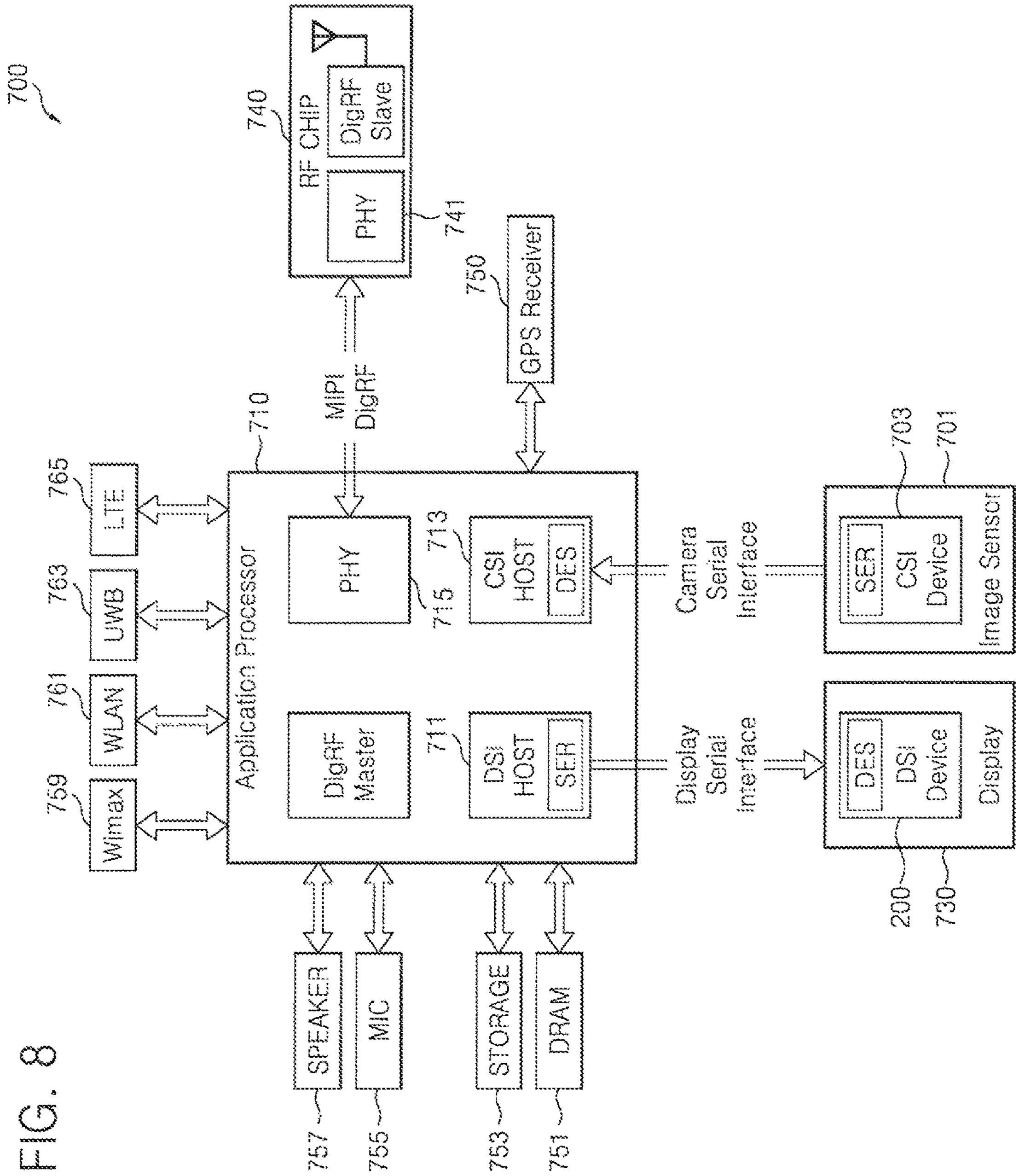
FIG. 8 is a block diagram of a display system, according to various embodiments of the present inventive concepts.

FIG. 8 is a block diagram of a display system 700, according to various embodiments of the present inventive concepts. Referring to FIGS. 2 through 8, the display system 700 may be implemented as a portable electronic device which can use or support mobile industry processor interface (MIPI).

The display system 700 may be a portable electronic device including a display 730. The portable electronic device may be the one illustrated in FIG. 1. The display system 700 includes an application processor 710, an image sensor 701, and the display 730.

A camera serial interface (CSI) host 713 implemented in the application processor 710 may perform serial communication with a CSI device 703 included in the image sensor 701 through CSI. At this time, a deserializer DES and a serializer SER may be implemented in the CSI host 713 and the CSI device 703, respectively.

A DSI host 711 implemented in the application processor 710 may perform serial communication with a DSI device 200 included in the display 730 through DSI. The DSI device 200 may be the display driver IC 200 described with reference to FIGS. 2 through 7. A serializer SER and a deserializer DES may be implemented in the DSI host 711 and the DSI device 200, respectively. The deserializers DES and the serializers SER may process electrical signals or optical signals.

The display system 700 may also include a radio frequency (RF) chip 740 communicating with the application processor 710. A physical layer (PHY) 715 of the application processor 710 and a PHY 741 of the RF chip 740 may communicate data with each other according to MIPI DigRF. The display system 700 may further include a global positioning system (CPS) receiver 750, a memory 751 such as dynamic random access memory (DRAM), a data storage device 753 implemented as a non-volatile memory such as a NAND flash memory, a microphone (MIC) 755, and a speaker 757.

The display system 700 may communicate with external devices using at least one communication protocol or standard, such as worldwide interoperability for microwave access (Wimax) 759, a wireless local area network (WLAN) 761, ultra-wideband (UWB) 763, and/or long term evolution (LTE) 765. The display system 700 may also communicate with external devices using Bluetooth or Wi-Fi.

Figure 9:
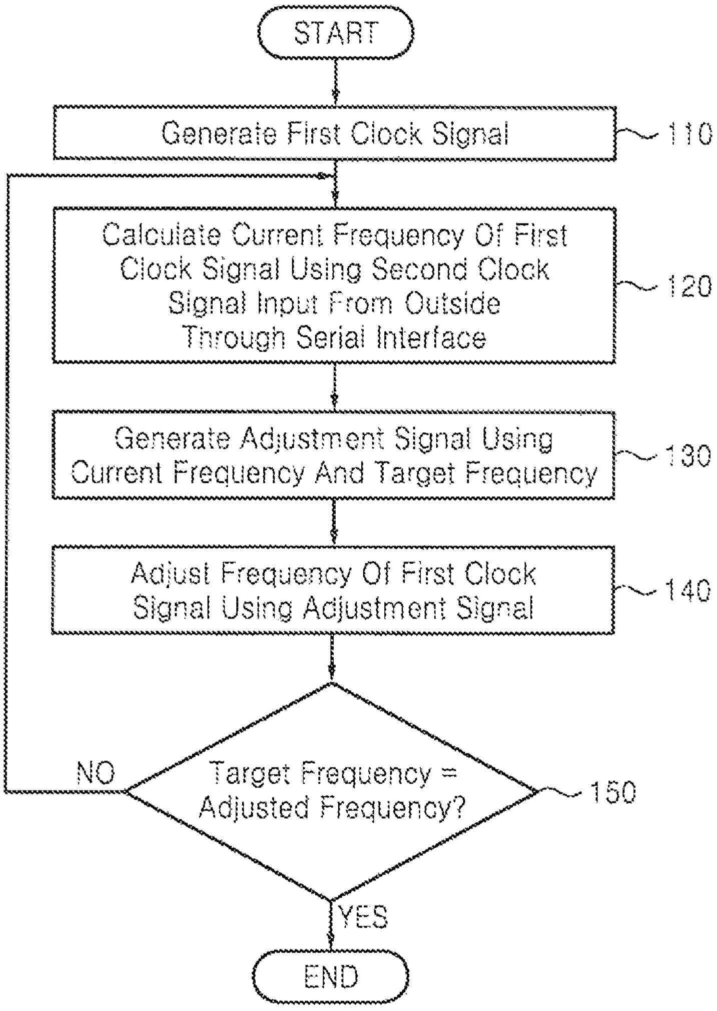
FIG. 9 is a flowchart of a method of operating a display system, according to various embodiments of the present inventive concepts.

FIG. 9 is a flowchart of a method of operating the display system 100, according to various embodiments of the present inventive concepts. Referring to FIGS. 1 through 9, the oscillator 220A or 220B (collectively denoted by 220) generates the first clock signal OSC, which may have a frequency different from the target frequency of the target clock signal TCLK due to process variation, voltage variation, and/or temperature variation, in operation 110.

The frequency compensation circuit 231 calculates the current frequency CUF of the first clock signal OSC using the second clock signal RCLK, which is input from the outside through, for example, serial interface, as a reference clock signal in operation 120. The frequency compensation circuit 231 generates the adjustment signal CODE using the target frequency and the current frequency CUF in operation 130. The oscillator 220 adjusts the frequency of the first clock signal OSC based on the adjustment signal CODE in operation 140.

The frequency compensation circuit 231 calculates the current frequency CUF of the first clock signal OSC, which has been frequency-adjusted, using the second clock signal RCLK and compares the target frequency of the target clock signal TCLK with the current frequency CUF. When it is decided as the comparison result that the current frequency CUF is not the same as the target frequency or is out of the allowable range for the target frequency in operation 150, operations 120 through 150 are repeated. On the other hand, when the current frequency CUF is the same as the target frequency or is within the allowable range for the target frequency in operation 150, the frequency compensation circuit 231 terminates the frequency compensation.

As described above with reference to FIGS. 1 through 9, the frequency of the first clock signal OSC is adjusted to the target frequency in real time through the mutual operation between the oscillator 220 and the frequency compensation circuit 231.

According to some embodiments of the inventive concept, a display driver IC controls in real time the frequency of a clock signal of an oscillator to be insensitive to process variation, voltage variation, and temperature variation using an external clock signal. Therefore, the oscillator generates an internal clock signal having a constant frequency, thereby reducing flickers occurring in a display driven by the display driver IC.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A display driver integrated circuit (IC) comprising:

an oscillator configured to generate a first clock signal; and a frequency compensation circuit configured to calculate a frequency of the first clock signal using a second clock signal that is inputted from an external device, and configured to generate an adjustment signal using the frequency of the first clock signal and a target frequency, wherein the oscillator is configured to adjust the frequency of the first clock signal in response to the adjustment signal until the frequency of the first clock signal is the same as the target frequency or enters an allowable range for the target frequency, and wherein the frequency compensation circuit comprises a register configured to store a reference time setting signal, the reference time setting signal comprising a first signal indicating at least one of a frequency or period of the second clock signal and a second signal indicating a number of toggles of the second clock signal.

2. The display driver IC of claim 1, further comprising a serial interface configured to perform serial communication with the external device.

3. The display driver IC of claim 2, wherein the serial interface is a mobile industry processor interface (MIPI).

4. The display driver IC of claim 2, wherein the serial interface is a display serial interface (DSI).

5. The display driver IC of claim 1, wherein the frequency compensation circuit is configured to output the adjustment signal to the oscillator.

6. The display driver IC of claim 1, wherein the oscillator includes a resistor-capacitor (RC) control circuit configured to control an RC value that is inversely proportional with the frequency of the first clock signal using the adjustment signal.

7. The display driver IC of claim 1, wherein the oscillator is configured to adjust the frequency of the first clock signal in real time in response to the adjustment signal.

8. A display driver integrated circuit (IC) comprising:

an oscillator configured to generate a first clock signal; and a frequency compensation circuit configured to calculate a frequency of the first clock signal using a second clock signal that is inputted from an external device, configured to generate an adjustment signal using the frequency of the first clock signal and a target frequency, and configured to output the adjustment signal to the oscillator, wherein the oscillator is configured to adjust the frequency of the first clock signal using the adjustment signal, wherein the oscillator is further configured to generate the first clock signal based on a comparison of a first control voltage and a second control voltage and to output a first feedback signal, wherein a first level of the first control voltage is controlled in response to the adjustment signal, wherein a second level of the second control voltage is controlled in response to the first feedback signal, and wherein the frequency compensation circuit comprises a register configured to store a reference time setting signal, the reference time setting signal comprising a first signal indicating at least one of a frequency or period of the second clock signal and a second signal indicating a number of toggles of the second clock signal.

9. The display driver IC of claim 8, further comprising a serial interface configured to perform serial communication with the external device.

10. The display driver IC of claim 9, wherein the serial interface is a display serial interface (DSI).

11. The display driver IC of claim 8, wherein the oscillator includes a resistor-capacitor (RC) control circuit configured to control an RC value that is inversely proportional with the frequency of the first clock signal using the adjustment signal.

12. The display driver IC of claim 8, wherein the oscillator is configured to adjust the frequency of the first clock signal in response to the adjustment signal until the frequency of the first clock signal is the same as the target frequency or enters an allowable range for the target frequency.

13. A display driver integrated circuit (IC) comprising:

an oscillator configured to generate a first clock signal; and a frequency compensation circuit configured to calculate a frequency of the first clock signal using a second clock signal that is inputted from an external device, and configured to generate an adjustment signal using the frequency of the first clock signal and a target frequency, wherein the oscillator is configured to adjust the frequency of the first clock signal in real time in response to the adjustment signal, wherein the oscillator includes a resistor-capacitor (RC) control circuit configured to control an RC value that is inversely proportional with the frequency of the first clock signal using the adjustment signal, wherein an output of the RC control circuit is coupled to a first comparator and a second comparator, wherein the first comparator is configured to compare the output of the RC control circuit to a first divided voltage that is generated from a power supply voltage, wherein the second comparator is configured to compare the output of the RC control circuit to a second divided voltage, different from the first divided voltage, that is generated from the power supply voltage, and wherein the frequency compensation circuit comprises a register configured to store a reference time setting signal, the reference time setting signal comprising a first signal indicating at least one of a frequency or period of the second clock signal and a second signal indicating a number of toggles of the second clock signal.

14. The display driver IC of claim 13, further comprising a serial interface configured to perform serial communication with the external device.

15. The display driver IC of claim 14, wherein the serial interface is a mobile industry processor interface (MIPI).

16. The display driver IC of claim 14, wherein the serial interface is a display serial interface (DSI).

17. The display driver IC of claim 13, wherein the frequency compensation circuit is configured to output the adjustment signal to the oscillator.

18. The display driver IC of claim 13, wherein the oscillator is configured to adjust the frequency of the first clock signal in response to the adjustment signal until the frequency of the first clock signal is the same as the target frequency or enters an allowable range for the target frequency.

19. The display driver IC of claim 8, wherein the oscillator is further configured to generate the first clock signal based on a comparison of the first control voltage and a third control voltage and to further output a second feedback signal, and wherein a third level of the third control voltage is controlled in response to the second feedback signal.

* * * * *